US009607626B1

(12) United States Patent
Yang et al.

(10) Patent No.: US 9,607,626 B1
(45) Date of Patent: Mar. 28, 2017

(54) DYNAMICALLY RECONFIGURABLE FILTER BANK

(71) Applicant: Amazon Technologies, Inc., Seattle, WA (US)

(72) Inventors: Jun Yang, San Jose, CA (US); Colin Randall McEnroe, San Mateo, CA (US); Jian Guo, Sunnyvale, CA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 0 days.

(21) Appl. No.: 15/082,684

(22) Filed: Mar. 28, 2016

(51) Int. Cl.
*H03G 5/00* (2006.01)
*G10L 19/26* (2013.01)
*G10K 11/178* (2006.01)

(52) U.S. Cl.
CPC ............ *G10L 19/26* (2013.01); *G10K 11/178* (2013.01); *G10K 2210/30281* (2013.01)

(58) Field of Classification Search
CPC .............................. G10L 19/26; G10K 11/178
See application file for complete search history.

(56) References Cited

U.S. PATENT DOCUMENTS 6,405,227 B1 * 6/2002 Prakash ................. H03H 17/02 708/300
7,184,556 B1 * 2/2007 Johnson ................. H03G 5/005 381/59
8,050,434 B1 * 11/2011 Kato ....................... H04S 3/002 381/310
2006/0098827 A1 * 5/2006 Paddock ................. G10L 21/02 381/106
2007/0253575 A1 * 11/2007 Melanson ................ H04R 3/12 381/97

* cited by examiner

*Primary Examiner* — Simon King
(74) *Attorney, Agent, or Firm* — Seyfarth Shaw LLP; Ilan N. Barzilay; Cyrus A. Miller

(57) ABSTRACT

A reconfigurable filter bank system that has an asymmetrical tree structure with multiple stages to generate multiband outputs. Each stage may include cascaded low-pass filters (LPFs), cascaded high-pass filters (HPFs) and/or all-pass filter(s) (APF(s)) having identical phase responses. As the cascaded LPFs, cascaded HPFs and APF(s) have identical phase responses, each frequency band of the multiband output may have an identical phase shift such that the frequency bands are in-phase and can be added together. The multiband outputs of the reconfigurable filter bank may have near-perfect reconstruction (e.g., small number of cross-band ripples) and therefore only minor distortion. In addition, the number of frequency bands and corresponding non-uniform bandwidths (e.g., frequency ranges) may be user-adjustable and/or reconfigurable during device operation. Further, the reconfigurable filter bank may have reduced computational complexity and/or latency.

20 Claims, 12 Drawing Sheets

DYNAMICALLY RECONFIGURABLE FILTER BANK

BACKGROUND

To improve signal processing of audio data, signal processing may be performed on multiband outputs. For example, first signal processing may be performed on a first frequency band and second signal processing may be performed on a second frequency band, enabling improved performance. Multiband outputs may be generated by filter banks that separate audio data into multiple frequency bands.

BRIEF DESCRIPTION OF DRAWINGS

For a more complete understanding of the present disclosure, reference is now made to the following description taken in conjunction with the accompanying drawings.

DETAILED DESCRIPTION

Existing filter bank approaches, such as filter banks based on the discrete Fourier transform (DFT), discrete cosine transform (DCT), discrete sine transform (DST), finite-impulse-response quadrature-mirror-filter (FIR QMF) or the like, are not flexible for users to adjust or change the number of bands and the bandwidths during device operation, i.e. during device operation without requiring a hardware reconfiguration. In addition, existing filter bank approaches are very complicated, preventing implementation in a low power device during device operation. Moreover, the existing filter bank approaches can result in long latency (e.g., delay) and may not result in perfect reconstruction (e.g., frequency response includes cross-band ripples), resulting in increased distortion and low signal-to-noise ratios (SNRs).

To improve filter bank approaches, devices, systems and methods may include a reconfigurable filter bank having an asymmetrical tree structure with multiple stages to generate multiband outputs. Each stage may include cascaded low-pass filters (LPFs), cascaded high-pass filters (HPFs) and/or all-pass filter(s) (APF(s)) having identical phase responses.

As the cascaded LPFs, cascaded HPFs and APF(s) have identical phase responses, each frequency band of the multiband output may have an identical phase shift such that the frequency bands are in-phase and can be added together. The multiband outputs of the reconfigurable filter bank may have near-perfect reconstruction (e.g., small number of cross-band ripples) and therefore only minor distortion. In addition, the number of frequency bands and corresponding non-uniform bandwidths (e.g., frequency ranges) may be user-adjustable and/or reconfigurable during device operation. Further, the reconfigurable filter bank may have reduced computational complexity and/or latency.

Figure 1:
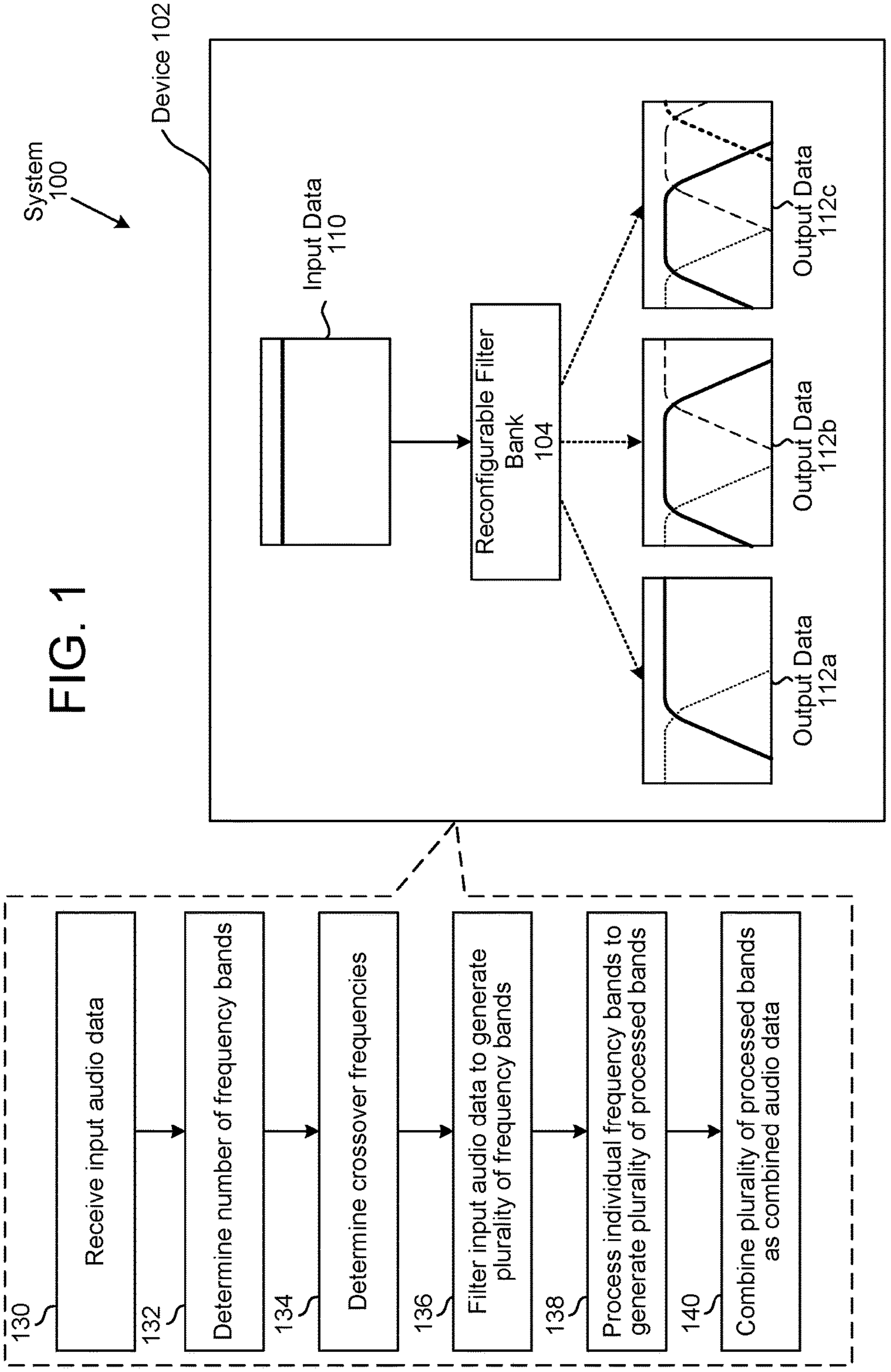
FIG. 1 illustrates a reconfigurable filter bank system according to embodiments of the present disclosure.

FIG. 1 illustrates a high-level conceptual block diagram of a system including a reconfigurable filter bank according to embodiments of the present disclosure. As illustrated in FIG. 1, a system 100 may include a device 102 having a reconfigurable filter bank 104. The reconfigurable filter bank 104 may receive input data 110, which is illustrated as a straight line indicating that the input data 110 corresponds to all frequencies, and may generate multiband output data 112. For example, first output data 112*a* includes two frequency bands, second output data 112*b* includes three frequency bands and third output data 112*c* includes four frequency bands. However, the present disclosure is not limited thereto and the reconfigurable filter bank 104 may generate output data 112 having any number of frequency bands without departing from the disclosure.

The reconfigurable filter bank 104 may be reconfigurable during device operation by a user, application and/or component of the device 102. As a first example, the reconfigurable filter bank 104 may be used to separate audio data into multiple frequency bands for an audio equalizer, enabling the user to selectively control individual frequency bands during audio playback. Thus, using the audio equalizer the user may increase a gain associated with low frequencies (e.g., low-pitched audio frequencies known as bass) and high frequencies (e.g., high-pitched audio frequencies known as treble) while decreasing a gain associated with intervening frequencies (e.g., medium-pitched audio frequencies known as midrange). Using the reconfigurable filter bank 104, the user may also control the individual frequency bands, including selecting a total number of frequency bands and selecting crossover frequencies (e.g., fc1, fc2, fc3, etc.) between frequency bands.

To illustrate an example, at a first time the user may configure the reconfigurable filter bank 104 to output ten equal frequency bands, such that each frequency band includes a fixed frequency range. The user may then operate the audio equalizer to individually control a magnitude corresponding to each of the ten frequency bands. However, at a second time the user may reconfigure the reconfigurable filter bank 104 to output six frequency bands, with each frequency band having a variable frequency range. For example, a first range may correspond to deep bass (e.g., 0-80 Hz) that may be played by a subwoofer (e.g., subwoofer output data), a second range may correspond to upper bass (e.g., 80-250 Hz), a third range may correspond to lower midrange (e.g., 250-1000 Hz), a fourth range may correspond to upper midrange (e.g., 1-2 kHz), a fifth range may correspond to lower treble (e.g., 2-3.5 kHz) and a sixth range may correspond to upper treble (e.g., 3.5-20 kHz). Thus, the reconfigurable filter bank 104 may generate deep bass output data (e.g., subwoofer output data), upper bass output data, lower midrange output data, upper midrange output data, lower treble output data and/or upper treble output data. Therefore, the user may control a total number of frequency bands and precisely select the crossover frequencies during device operation, enabling the user precise control over the audio equalizer.

For ease of illustration, the first example described above refers to the user configuring the reconfigurable filter bank 104. However, the disclosure is not limited thereto and applications and/or components of the device 102 may also configure the reconfigurable filter bank 104 without departing from the disclosure. To illustrate a second example, audio signal processing may comprise a number of steps performed by discrete applications and/or components, and each application/component may operate on a different number of frequency bands and/or different frequency bands. For example, a beamformer component may output first audio data including four frequency bands whereas an Acoustic Echo Cancellation (AEC) component may perform AEC using five frequency bands. Therefore, the reconfigurable filter bank 104 may receive the first audio data (e.g., four frequency bands), may combine the four frequency bands to generate combined audio data and may separate the combined audio data into second audio data (e.g., five frequency bands), enabling the AEC component to perform AEC on the second audio data. Signal processing may perform additional steps beyond beamforming and AEC and therefore the device 102 may include additional applications/components in addition to the beamformer component and the AEC component without departing from the present disclosure.

Audio data may correspond to multiple frequencies, such as a frequency range from 0 Hz to 20 kHz. Therefore, audio data may be separated into frequency ranges, which may be referred to as frequency bands. As used herein, multiband output may include multiple frequency bands, such as a first frequency band (e.g., 0-250 Hz), a second frequency band (e.g., 250-2,000 Hz) and a third frequency band (e.g., 2-20 kHz). Individual frequency bands may be combined (e.g., first frequency band and second frequency band may be combined to form a fourth frequency band (e.g., 0-2,000 Hz)) or separated into additional frequency bands (e.g., third frequency band may be separated into a fourth frequency band (e.g., 2-6 kHz) and a fifth frequency band (e.g., 6-20 kHz)).

For ease of illustration, the disclosure may refer to the frequency bands as being discrete, such that a frequency of 240 Hz is included in the first frequency band and not the second frequency band. However, the disclosure is not limited thereto and the frequency bands may overlap without departing from the disclosure. For example, the first frequency band and the second frequency band may both include data corresponding to 240 Hz. However, the reconfigurable filter bank 104 may pass (e.g., maintain a gain of 0 dB) first data corresponding to 240 Hz in the first frequency band, whereas the reconfigurable filter bank 104 may attenuate (e.g., decrease a gain below 0 dB) second data corresponding to 240 Hz in the second frequency band, as will be discussed in greater detail below with regard to at least FIGS. 4A-4B. For example, the second frequency band may correspond to a first range of frequencies (e.g., 250-2,000 Hz) having a large magnitude (e.g., gain relatively close to 0 dB) while also including frequencies outside the first range (e.g., 150-250 Hz and 2,000-2,500 Hz) that have a relatively small magnitude (e.g., gain −10 dB or below).

As used herein, crossover frequencies are frequencies separating the frequency bands. For example, a first crossover frequency (e.g., fc1=250 Hz) may separate the first frequency band from the second frequency band and a second crossover frequency (e.g., fc2=2,000 Hz) may separate the second frequency band from the third frequency band. Thus, the reconfigurable filter bank 104 may filter audio data using the first crossover frequency (e.g., fc1=250 Hz) to generate the first frequency band. In order to filter the audio data, the reconfigurable filter bank 104 may use one or more low-pass filters having a cutoff frequency equal to the first crossover frequency. Thus, the low-pass filters may have a passband region (e.g., 0-250 Hz) with relatively small attenuation or loss (e.g., 0 to −5 dB) and a stopband region (e.g., 250 Hz and above) with relatively large attenuation or loss (e.g., −5 to −100 dB or below).

Similarly, the reconfigurable filter bank 104 may filter audio data using the first crossover frequency (e.g., fc1=250 Hz) and the second crossover frequency (e.g., fc2=2,000 Hz) to generate the second frequency band. For example, the reconfigurable filter bank 104 may use one or more high-pass filters having a cutoff frequency equal to the first crossover frequency to generate first audio data. Thus, the high-pass filters may have a passband region (e.g., 250 Hz and above) with relatively small attenuation or loss (e.g., 0 to −5 dB) and a stopband region (e.g., 250 Hz and below) with relatively large attenuation or loss (e.g., −5 to −100 dB or below). After filtering the audio data with the high-pass filters to generate the first audio data, the reconfigurable filter bank 104 may use one or more low-pass filters having a cutoff frequency equal to the second crossover frequency to generate second audio data (e.g., second frequency band). Thus, the low-pass filters may have a passband region (e.g., 2,000 Hz and below) with relatively small attenuation or loss (e.g., 0 to −5 dB) and a stopband region (e.g., 2,000 Hz and above) with relatively large attenuation or loss (e.g., −5 to −100 dB or below).

While the disclosure describes the reconfigurable filter bank 104 having passband regions with relatively small attenuation or loss (e.g., 0 to −5 dB) and stopband regions with relatively large attenuation or loss (e.g., −5 to −100 dB or below), the disclosure is not limited thereto. For example, the reconfigurable filter bank 104 may include passive devices (e.g., filters) associated with gains of 0 dB or below (e.g., attenuation or losses) and/or active devices (e.g., amplifiers) associated with gains of 1 dB or above (e.g., gain or amplification factor). For purposes of this disclosure, what is important is that the reconfigurable filter bank 104 separates audio data using passband regions of similar magnitudes and stopband regions of relatively small magnitudes. In addition to high-pass filters and low-pass filters, the reconfigurable filter bank 104 may include all-pass filters that have a wide passband region.

While the disclosure describes examples of using the reconfigurable filter bank 104 to separate frequency bands of single channel audio, the disclosure is not limited thereto. Instead, the reconfigurable filter bank 104 may be used for any number of channels, such as stereo audio (e.g., left channel and right channel), surround sound audio (e.g., 5.1, 7.1 or the like) and/or other types of audio without departing from the present disclosure. For example, the device 102 may use the reconfigurable filter bank 104 for a first channel of audio (e.g., left channel) and then use the reconfigurable filter bank 104 for a second channel of audio (e.g., right channel). In some examples, the device 102 may reconfigure the reconfigurable filter bank 104 between channels of the audio input. For example, the device 102 may use a first filter bank to process a first channel associated with a subwoofer in surround sound audio and may use a second filter bank to process remaining channels. Additionally or alternatively, the device 102 may use a first filter bank to process a reference signal (e.g., playback signal sent to speakers) and may use a second filter bank to process a target signal (e.g., input signal received from microphone).

As illustrated in FIG. 1, the device 102 may receive (130) input audio data, may determine (132) a number of frequency bands and determine (134) crossover frequencies corresponding to the frequency bands. Using the crossover frequencies, the device 102 may filter (136) the input audio data to generate a plurality of frequency bands. For example, the device 102 may use a first crossover frequency (e.g., fc1=250 Hz) and a second crossover frequency (e.g., fc2=2,000 Hz) to generate a first frequency band (e.g., 0-250 Hz), a second frequency band (e.g., 250-2,000 Hz) and a third frequency band (e.g., 2-20 kHz).

After generating the plurality of frequency bands, the device 102 may process (138) individual frequency bands of the plurality of frequency bands to generate a plurality of processed bands. For example, the device 102 may perform signal processing on the first frequency band to generate a first processed band, on the second frequency band to generate a second processed band and on the third frequency band to generate a third processed band. Thus, the signal processing may be improved by limiting the signal processing to a narrow frequency range associated with the individual frequency bands. After generating the plurality of processed bands, the device 102 may optionally combine (140) the plurality of processed bands as combined audio data. Thus, the device 102 may output the plurality of processed bands individually and/or the combined audio data.

As discussed above, examples of signal processing may include beamforming, Acoustic Echo Cancellation (AEC), compression or the like. Beamforming may be performed on audio data captured by a microphone array in order to generate multiple audio signals, each audio signal corresponding to a unique direction relative to the microphone array. AEC may remove the acoustic echo (e.g., the outgoing audio data of a loudspeaker and their reflected sounds) from incoming audio data captured by microphone(s) (e.g., acoustic echo and near-end additional sounds) to remove the acoustic echo and isolate the near-end additional sounds (e.g., near-end speech and noise) as isolated audio data.

The device 102 may compress audio data using multiple frequency bands in order to improve a clarity of the resulting compressed audio data. For example, a first compression method (e.g., low compression) may result in high fidelity audio having little distortion but a relatively large size, whereas a second compression method (e.g., high compression) may result in low fidelity audio having a relatively small size but increased distortion. For signal processing associated with speech recognition or the like, the device 102 may separate the audio data into first frequency ranges associated with fundamental bass frequency range (e.g., 80 to 880 Hz) and second frequency ranges (e.g., 0-80 Hz (deep bass range) and 880 Hz and above (tonal and nasal ranges)). To reduce a size of the compressed audio data while maintaining low distortion, the device 102 may compress a first portion of audio data associated with the first frequency ranges using the first compression method (e.g., low compression) and compress a second portion of audio data associated with the second frequency ranges using the second compression method (e.g., high compression).

Multiband output of the reconfigurable filter bank 104 may have near-perfect reconstruction, meaning that there are a small number of cross-band ripples and therefore only minor distortion as a result of generating the multiband output. In addition, the number of frequency bands and corresponding non-uniform bandwidths (e.g., frequency ranges) may be user-adjustable and/or reconfigurable during device operation. For example, the device 102 may dynamically adjust values of crossover frequencies (e.g., fc1, fc2, etc.) to adjust the bandwidths of each frequency band. As phase responses of a LPF pair (e.g., two LPFs in series), HPF pair (e.g., two HPFs in series) and APF are identical, the multiband output of the reconfigurable filter bank 104 may be in-phase and can be added together.

Additionally, as the reconfigurable filter bank 104 does not include "Delay" and/or "Look-ahead" components, nor overlap-add and block-processing, the reconfigurable filter bank 104 has a relatively small (e.g., minimal) algorithm latency. Similarly, as the components are second-order IIR filters, the computational complexity required by the reconfigurable filter bank 104 is relatively low. For example, IIR filters differ only by filter coefficients and can share one IIR biquad subroutine, resulting in relatively low memory consumption (e.g., read-only memory). The reconfigurable filter bank 104 may be used for any signal processing system that needs filter bank/multiband processing, including beamforming, AEC, noise suppression, compression or the like. In addition, the reconfigurable filter bank 104 can function using any sampling rate, including 48 kHz, 44.1 kHz, 32 kHz, 24 kHz, 22.05 kHz, 16 kHz, 11.025 kHz, and 8 kHz. Finally, the reconfigurable filter bank 104 may be implemented in the digital domain or in the analog domain by using analog circuits. For example, analog filters may be adjustable using resistance/capacitance, as the RC time constant may contribute to the crossover frequency. Thus, adjustable resistors and capacitors allow analog circuits to be reconfigurable.

Figure 2A:
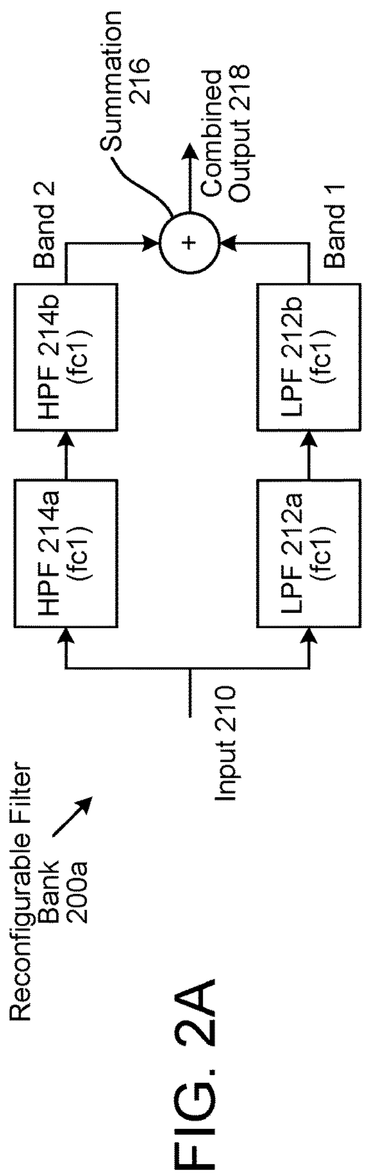
FIGS. 2A-2C illustrate examples of filter banks according to embodiments of the present disclosure.
Figure 2B:
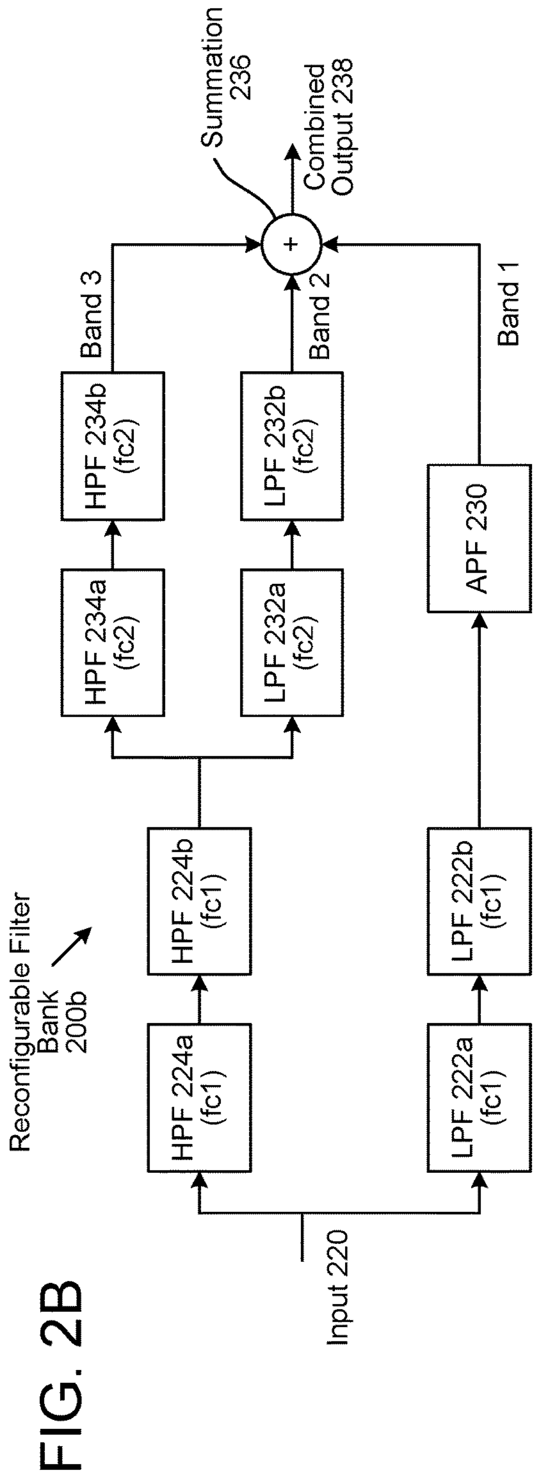
Figure 2C:
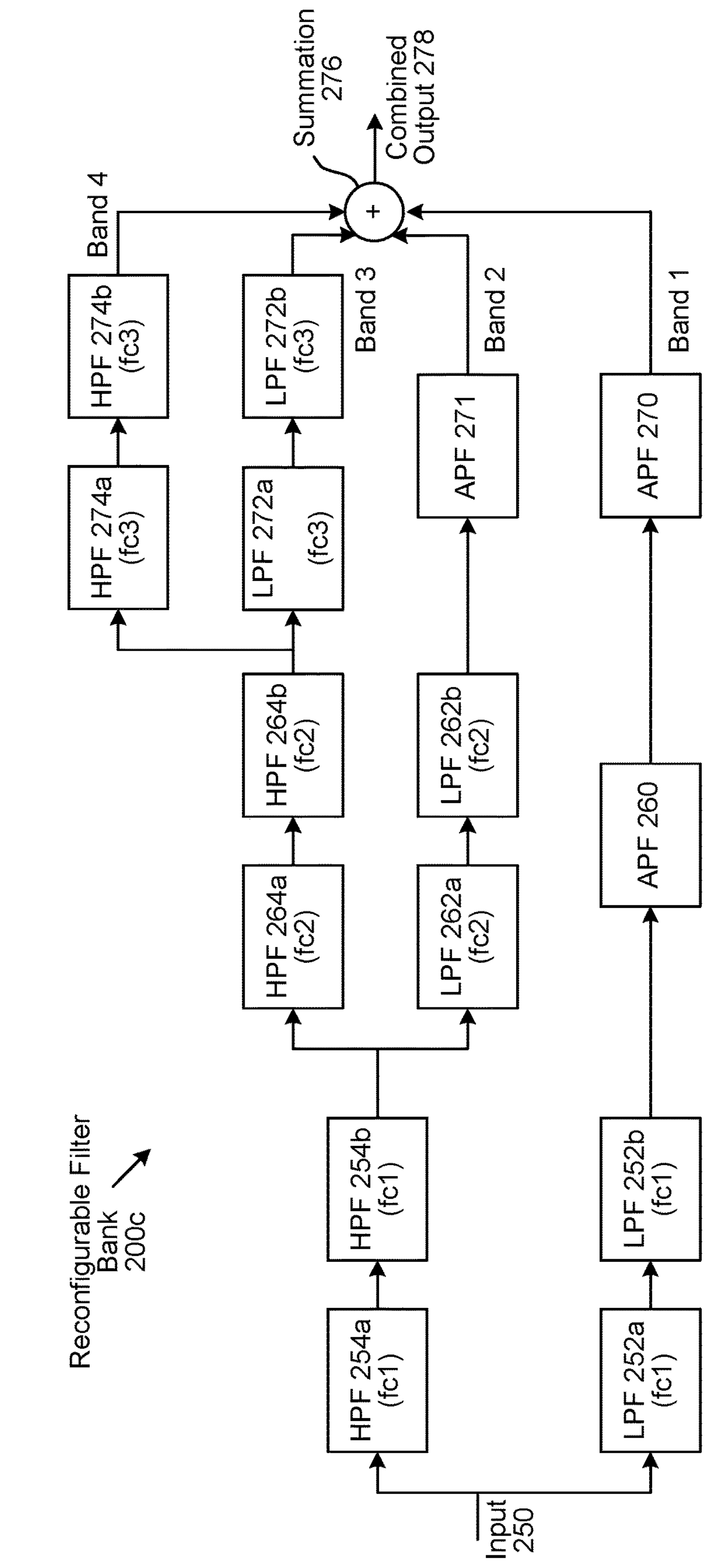

FIGS. 2A-2C illustrate examples of filter banks according to embodiments of the present disclosure. FIG. 2A illustrates a first reconfigurable filter bank 200*a* generating a two-band output. As illustrated in FIG. 2A, the first reconfigurable filter bank 200*a* may receive input 210 and generate the two-band output using a pair of low-pass filters (LPFs) 212 (e.g., 212*a* and 212*b*) and a pair of high-pass filters (HPFs) 214 (e.g., 214*a* and 214*b*). For example, the LPFs 212 may have a cutoff frequency equal to a first crossover frequency (e.g., fc1), resulting in a passband region (e.g., below fc1) with relatively small attenuation or loss (e.g., 0 to −5 dB) and a stopband region (e.g., above fc1) with relatively large attenuation or loss (e.g., −5 to −100 dB or below). A first portion of the input 210 included in the passband region of the LPFs 212 may be output as Band 1. Similarly, the HPFs 214 may have a cutoff frequency equal to the first crossover frequency, resulting in a passband region (e.g., above fc1) with relatively small attenuation or loss (e.g., 0 to −5 dB) and a stopband region (e.g., below fc1) with relatively large attenuation or loss (e.g., −5 to −100 dB or below). A second portion of the input 210 included in the passband region of the HPFs 214 may be output as Band 2.

Thus, Band 1 includes frequencies up to the first crossover frequency (e.g., fc1 and below) and Band 2 includes frequencies above the first crossover frequency (e.g., fc1 and above). The first reconfigurable filter bank 200*a* may output Band 1 and Band 2 individually or may use summation 216 to combine Band 1 with Band 2 to generate combined output 218.

FIG. 2B illustrates a second reconfigurable filter bank 200*b* generating a three-band output. As illustrated in FIG. 2B, the second reconfigurable filter bank 200*b* may receive input 220 and generate the three-band output using a first pair of LPFs 222 (e.g., 222*a* and 222*b*), a first pair of HPFs 224 (e.g., 224*a* and 224*b*), an all-pass filter (APF) 230, a second pair of LPFs 232 (e.g., 232*a* and 232*b*), and a second pair of HPFs 234 (e.g., 234*a* and 234*b*). For example, the first LPFs 222 and the first HPFs 224 may have a cutoff frequency equal to the first crossover frequency (e.g., fc1), separating the input 220 into a first portion (e.g., output of the LPFs 222) and a second portion (e.g., output of the HPFs 224) as discussed above with regard to FIG. 2A.

The APF 230 may pass the first portion of the input 220 to generate Band 1. The APF 230 may have a wide passband region passing a majority of the first portion of the input 220 without attenuation. While the APF 230 does not attenuate the first portion, the APF 230 has a similar phase response to the second LPFs 232 and the second HPFs 234. In some examples, the APF 230 may be associated with a second crossover frequency (e.g., fc2), although the disclosure is not limited thereto.

The second LPFs 232 may receive the second portion of the input 220 and may have a cutoff frequency equal to the second crossover frequency (e.g., fc2), resulting in a passband region (e.g., below fc2) with relatively small attenuation or loss (e.g., 0 to −5 dB) and a stopband region (e.g., above fc2) with relatively large attenuation or loss (e.g., −5 to −100 dB or below). The second portion of the input 220 included in the passband region of the second LPFs 232 may be output as Band 2. Similarly, the second HPFs 234 may have a cutoff frequency equal to the second crossover frequency, resulting in a passband region (e.g., above fc2) with relatively small attenuation or loss (e.g., 0 to −5 dB) and a stopband region (e.g., below fc2) with relatively large attenuation or loss (e.g., −5 to −100 dB or below). The second portion of the input 220 included in the passband region of the second HPFs 234 may be output as Band 3.

Thus, Band 1 includes frequencies up to the first crossover frequency (e.g., fc1 and below), Band 2 includes frequencies between the first crossover frequency and the second crossover frequency (e.g., fc1-fc2) and Band 3 includes frequencies above the second crossover frequency (e.g., fc2 and above). The second reconfigurable filter bank 200*b* may output Band 1, Band 2 and Band 3 individually or may use summation 236 to combine Bands 1-3 to generate combined output 238.

FIG. 2C illustrates a third reconfigurable filter bank 200*c* generating a four-band output. As illustrated in FIG. 2C, the third reconfigurable filter bank 200*c* may receive input 250 and generate the four-band output using a first pair of LPFs 252 (e.g., 252*a* and 252*b*), a first pair of HPFs 254 (e.g., 254*a* and 254*b*), a first APF 260, a second pair of LPFs 262 (e.g., 262*a* and 262*b*), a second pair of HPFs 264 (e.g., 264*a* and 264*b*), a second APF 270, a third APF 271, a third pair of LPFs 272 (e.g., 272*a* and 272*b*) and a third pair of HPFs 274 (e.g., 274*a* and 274*b*). For example, the first LPFs 252 and the first HPFs 254 may have a cutoff frequency equal to the first crossover frequency (e.g., fc1) and the first APF 260, the second LPFs 262 and the second HPFs 264 may have a cutoff frequency equal to the second crossover frequency (e.g., fc2), separating the input 250 into a first portion (e.g., output of the APF 260), a second portion (e.g., output of the LPFs 262) and a third portion (e.g., output of the HPFs 264) as discussed above with regard to FIG. 2B.

The second APF 270 may pass the first portion of the input 250 to generate Band 1 and the third APF 271 may pass the second portion of the input 250 to generate Band 2. The second APF 270 and the third APF 271 may have a wide passband region passing a majority of the first portion and second portion of the input 250 without attenuation. While the second APF 270 and the third APF 271 do not attenuate the first portion or the second portion of the input 250, the second APF 270 and the third APF 271 have a similar phase response to the third LPFs 272 and the third HPFs 274. In some examples, the second APF 270 and the third APF 271 may be associated with a third crossover frequency (e.g., fc3), although the disclosure is not limited thereto.

The third LPFs 272 may receive the third portion of the input 250 and may have a cutoff frequency equal to the third crossover frequency (e.g., fc3), resulting in a passband region (e.g., below fc3) with relatively small attenuation or loss (e.g., 0 to −5 dB) and a stopband region (e.g., above fc3) with relatively large attenuation or loss (e.g., −5 to −100 dB or below). The third portion of the input 250 included in the passband region of the third LPFs 272 may be output as Band 3. Similarly, the third HPFs 274 may have a cutoff frequency equal to the third crossover frequency, resulting in a passband region (e.g., above fc3) with relatively small attenuation or loss (e.g., 0 to −5 dB) and a stopband region (e.g., below fc3) with relatively large attenuation or loss (e.g., −5 to −100 dB or below). The third portion of the input 250 included in the passband region of the third HPFs 274 may be output as Band 4.

Thus, Band 1 includes frequencies up to the first crossover frequency (e.g., fc1 and below), Band 2 includes frequencies between the first crossover frequency and the second crossover frequency (e.g., fc1-fc2), Band 3 includes frequencies between the second crossover frequency and the third crossover frequency (e.g., fc2-fc3) and Band 4 includes frequencies above the third crossover frequency (e.g., fc3 and above). The third reconfigurable filter bank 200*c* may output Band 1, Band 2, Band 3 and Band 4 individually or may use summation 276 to combine Bands 1-4 to generate combined output 278.

The low-pass filters may be second-order infinite impulse response (IIR) Butterworth low-pass filters. Similarly, the high-pass filters may be second-order IIR Butterworth high-pass filters, and the all-pass filters may be second-order IIR Butterworth all-pass filters configured to pass a majority of the frequencies included in the audio data. The all-pass filters may be designed for the purpose of phase response matching between frequency bands, such that outputs of the all-pass filters have an identical phase response to outputs of the LPFs and HPFs.

Figure 3A:
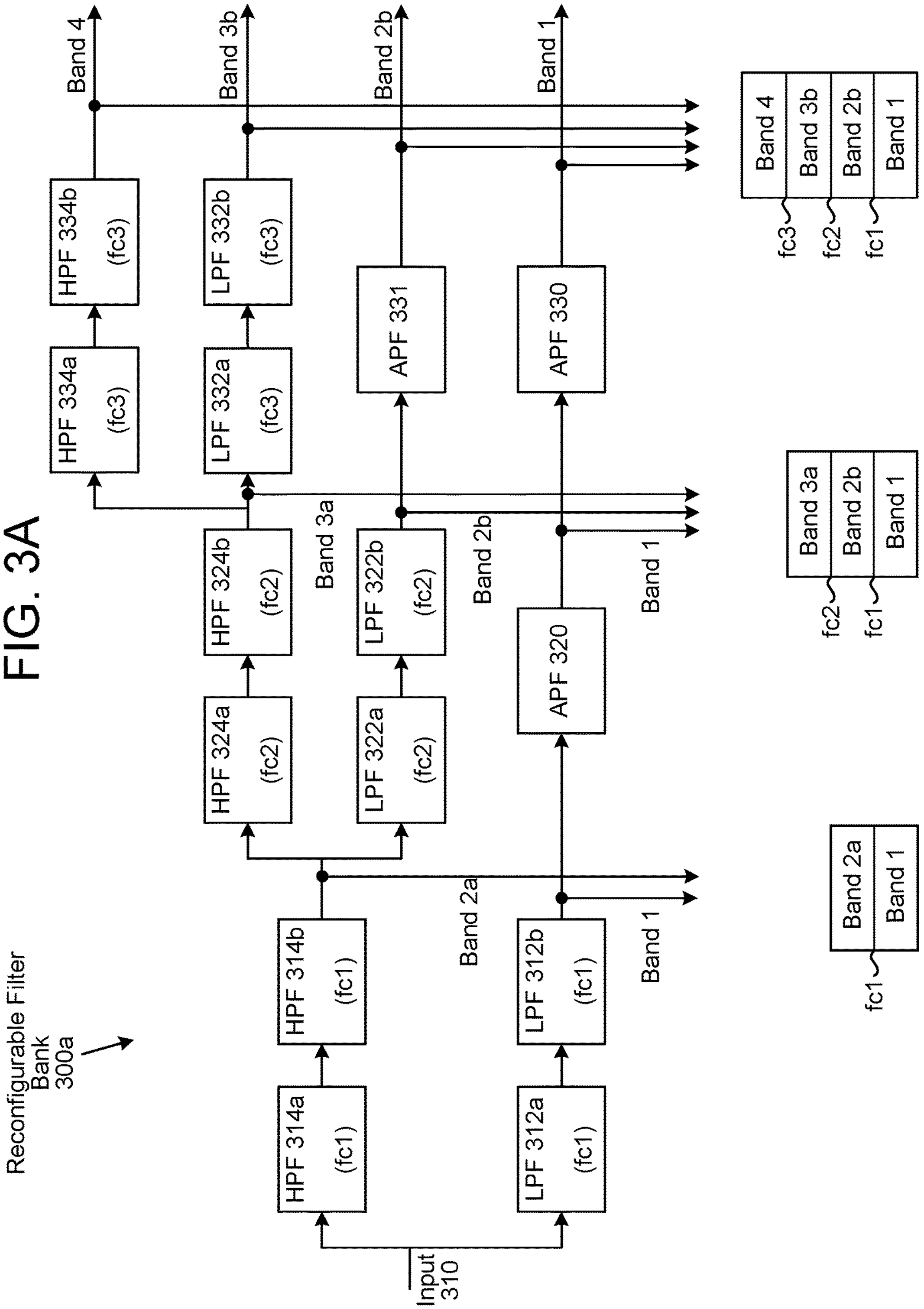
FIGS. 3A-3B illustrate examples of reconfigurable filter banks according to embodiments of the present disclosure.
Figure 3B:
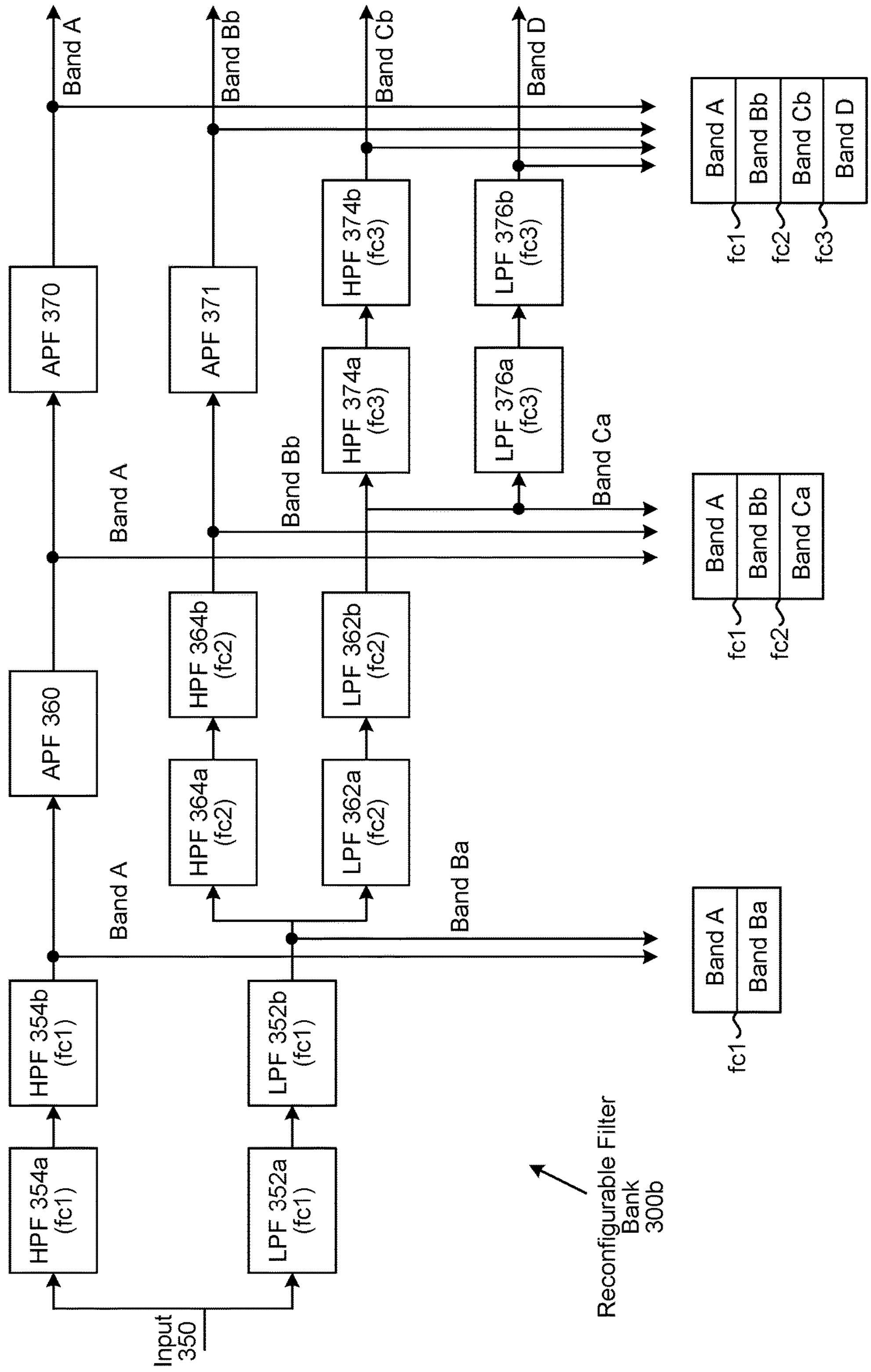

FIGS. 3A-3B illustrate examples of reconfigurable filter banks according to embodiments of the present disclosure. FIG. 3A illustrates a first reconfigurable filter bank 300*a* that splits outputs of high-pass filters (314, 324, 334, etc.), resulting in Band 1 being a low frequency band and Band 4 being a high frequency band. In contrast, FIG. 3B illustrates a second reconfigurable filter bank 300*b* that splits outputs of low-pass filters (352, 362, 376, etc.), resulting in Band A being a high frequency band and Band D being a low frequency band.

The first reconfigurable filter bank 300*a* functions identically to the reconfigurable filter bank 200*c* illustrated in FIG. 2C, so duplicate descriptions will be omitted. As illustrated in FIG. 3A, the first reconfigurable filter bank 300*a* may receive an input 310 and a first stage of the first reconfigurable filter bank 300*a* may separate the input 310 into Band 1 (using first LPFs 312) and Band 2*a* (using first HPFs 314) using a first crossover frequency (e.g., fc1). Thus, Band 1 corresponds to frequencies below the first crossover frequency (e.g., fc1 and below), Band 2*a* corresponds to frequencies above the first crossover frequency (e.g., fc1 and above), and the first reconfigurable filter bank 300*a* may output Band 1 and Band 2*a* from the first stage.

A second stage of the first reconfigurable filter bank 300*a* may separate Band 2*a* into Band 2*b* (using second LPFs 322) and Band 3*a* (using second HPFs 324) using a second crossover frequency (e.g., fc2), while maintaining a phase shift of Band 1 (using APF 320). Thus, Band 1 corresponds to frequencies below the first crossover frequency (e.g., fc1 and below), Band 2*b* corresponds to frequencies between the first crossover frequency and the second crossover frequency (e.g., fc1-fc2), Band 3*a* corresponds to frequencies above the second crossover frequency (e.g., fc2 and above), and the first reconfigurable filter bank 300*a* may output Band 1, Band 2*b* and Band 3*a* from the second stage.

A third stage of the first reconfigurable filter bank 300*a* may separate Band 3*a* into Band 3*b* (using third LPFs 332) and Band 4 (using third HPFs 334) using a third crossover frequency (e.g., fc3), while maintaining phase shifts of Band 1 (using APF 330) and Band 2*b* (using APF 331). Thus, Band 1 corresponds to frequencies below the first crossover frequency (e.g., fc1 and below), Band 2*b* corresponds to frequencies between the first crossover frequency and the second crossover frequency (e.g., fc1-fc2), Band 3*b* corresponds to frequencies between the second crossover frequency and the third crossover frequency (e.g., fc2-fc3), Band 4 corresponds to frequencies above the third crossover frequency (e.g., fc3 and above), and the first reconfigurable filter bank 300*a* may output Band 1, Band 2*b*, Band 3*b* and Band 4 from the third stage.

While the examples above describe a "first stage," a "second stage" and a "third stage," the stages may be referred to using similar language without departing from the present disclosure. For example, the first stage may be referred to as a "primary stage," the second stage may be referred to as a "secondary stage," the third stage may be referred to as a "tertiary stage" and so on. While not illustrated in FIG. 3A, the first reconfigurable filter bank 300*a* may include additional stages and may be configured to generate more than four frequency bands without departing from the present disclosure. For ease of simplicity, FIG. 3A illustrates Band 2*a* and 2*b* despite differences in frequency range between Band 2*a* and Band 2*b*. For example, Band 2*a* corresponds to a first frequency range (e.g., fc1 and above), while Band 2*b* corresponds to a second frequency range (e.g., fc1-fc2) that is a subset of the first frequency range. Similarly, Band 3*a* corresponds to a third frequency range (e.g., fc2 and above), while Band 3*b* corresponds to a fourth frequency range (e.g., fc2-fc3) that is a subset of the third frequency range. The first reconfigurable filter bank 300*a* may select a number of frequency bands to output along with the crossover frequencies separating the frequency band.

FIG. 3B illustrates the second reconfigurable filter bank 300*b*, which functions similarly to the first reconfigurable filter bank 300*a* illustrated in FIG. 3A, so duplicate descriptions will be omitted. It should be noted that FIG. 3A requires $0.0<fc1 \leq fc2 \leq fc3<fs/2$, while FIG. 3B requires $fs/2>fc1 \geq fc2 \geq fc3>0.0$. As illustrated in FIG. 3B, the second reconfigurable filter bank 300*b* may receive an input 350 and a first stage of the second reconfigurable filter bank 300*b* may separate the input 350 into Band A (using first HPFs 354) using a first crossover frequency (e.g., fc1) and Band Ba (using first LPFs 352). Thus, Band A corresponds to frequencies above the first crossover frequency (e.g., fc1 and above), Band Ba corresponds to frequencies below the first crossover frequency (e.g., fc1 and below), and the second reconfigurable filter bank 300*b* may output Band A and Band Ba from the first stage.

A second stage of the second reconfigurable filter bank 300*b* may separate Band Ba into Band Bb (using second HPFs 364) and Band Ca (using second LPFs 362) using a second crossover frequency (e.g., fc2), while maintaining a phase shift of Band A (using APF 360). Thus, Band A corresponds to frequencies above the first crossover frequency (e.g., fc1 and above), Band Bb corresponds to frequencies between the first crossover frequency and the second crossover frequency (e.g., fc1-fc2), Band Ca corresponds to frequencies below the second crossover frequency (e.g., fc2 and below), and the second reconfigurable filter bank 300*b* may output Band A, Band Bb and Band Ca from the second stage.

A third stage of the second reconfigurable filter bank 300*b* may separate Band Ca into Band Cb (using third HPFs 374) and Band D (using third LPFs 376) using a third crossover frequency (e.g., fc3), while maintaining phase shifts of Band A (using APF 370) and Band Bb (using APF 371). Thus, Band A corresponds to frequencies above the first crossover frequency (e.g., fc1 and above), Band Bb corresponds to frequencies between the first crossover frequency and the second crossover frequency (e.g., fc1-fc2), Band Cb corresponds to frequencies between the second crossover frequency and the third crossover frequency (e.g., fc2-fc3), Band D corresponds to frequencies below the third crossover frequency (e.g., fc3 and below), and the second reconfigurable filter bank 300*b* may output Band A, Band Bb, Band Cb and Band D from the third stage.

While not illustrated in FIG. 3B, the second reconfigurable filter bank 300*b* may include additional stages and may be configured to generate more than four frequency bands without departing from the present disclosure. For ease of simplicity, FIG. 3B illustrates Band Ba and Bb despite differences in frequency range between Band Ba and Band Bb. For example, Band Ba corresponds to a first frequency range (e.g., fc1 and below), while Band Bb corresponds to a second frequency range (e.g., fc1-fc2) that is a subset of the first frequency range. Similarly, Band Ca corresponds to a third frequency range (e.g., fc2 and below), while Band Cb corresponds to a fourth frequency range (e.g., fc2-fc3) that is a subset of the third frequency range. The second reconfigurable filter bank 300*b* may select a number of frequency bands to output along with the crossover frequencies separating the frequency band.

While FIGS. 3A-3B illustrate reconfigurable filter banks 300 using an asymmetrical tree structure, the disclosure is not limited thereto. Instead, the reconfigurable filter banks 300 may use a symmetrical tree structure without departing from the disclosure. For example, the first stage may generate two outputs and a second stage may split each of the two outputs to generate four outputs. Thus, instead of each additional stage in the asymmetrical tree structure resulting in an additional frequency band, each additional stage in the symmetrical tree structure may result in two additional frequency bands.

Figure 4A:
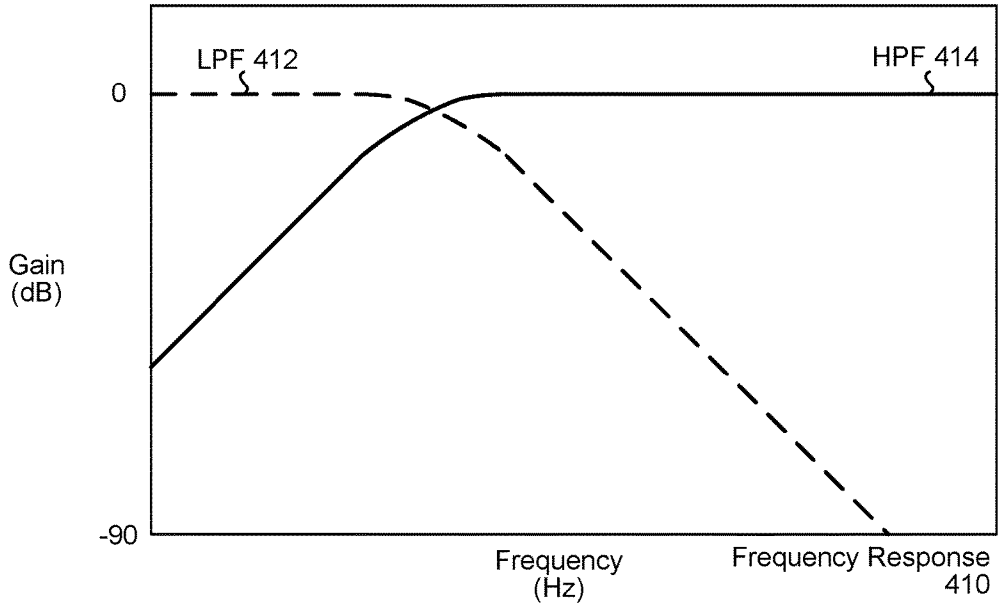
FIGS. 4A-4B illustrate magnitude responses of filters according to embodiments of the present disclosure.
Figure 4B:
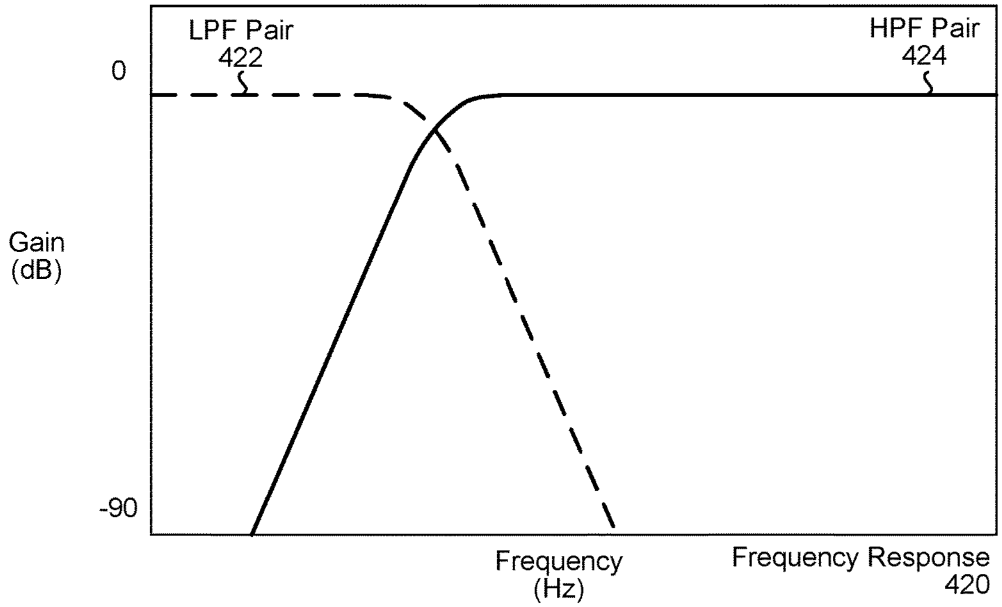

FIGS. 4A-4B illustrate magnitude responses of filters according to embodiments of the present disclosure. FIG. 4A illustrates a frequency response 410 of a single LPF 412 and a single HPF 414. As illustrated in FIG. 4A, frequency responses of the LPF 412/HPF 414 may remain flat during the passband regions and then attenuate at a first slope (e.g., difference in dB divided by difference in frequency) in the stopband regions. In contrast, FIG. 4B illustrates a frequency response 420 of an LPF pair 422 and an HPF pair 424. As illustrated in FIG. 4B, frequency responses of the LPF pair 422/HPF pair 424 may remain flat during the passband regions and then attenuate at a second slop in the stopband regions, with the second slope being significantly larger than the first slope. Thus, arranging two LPFs/HPFs in a cascaded pair results in improved filtering with a more significant attenuation at the crossover frequency.

Figure 5:
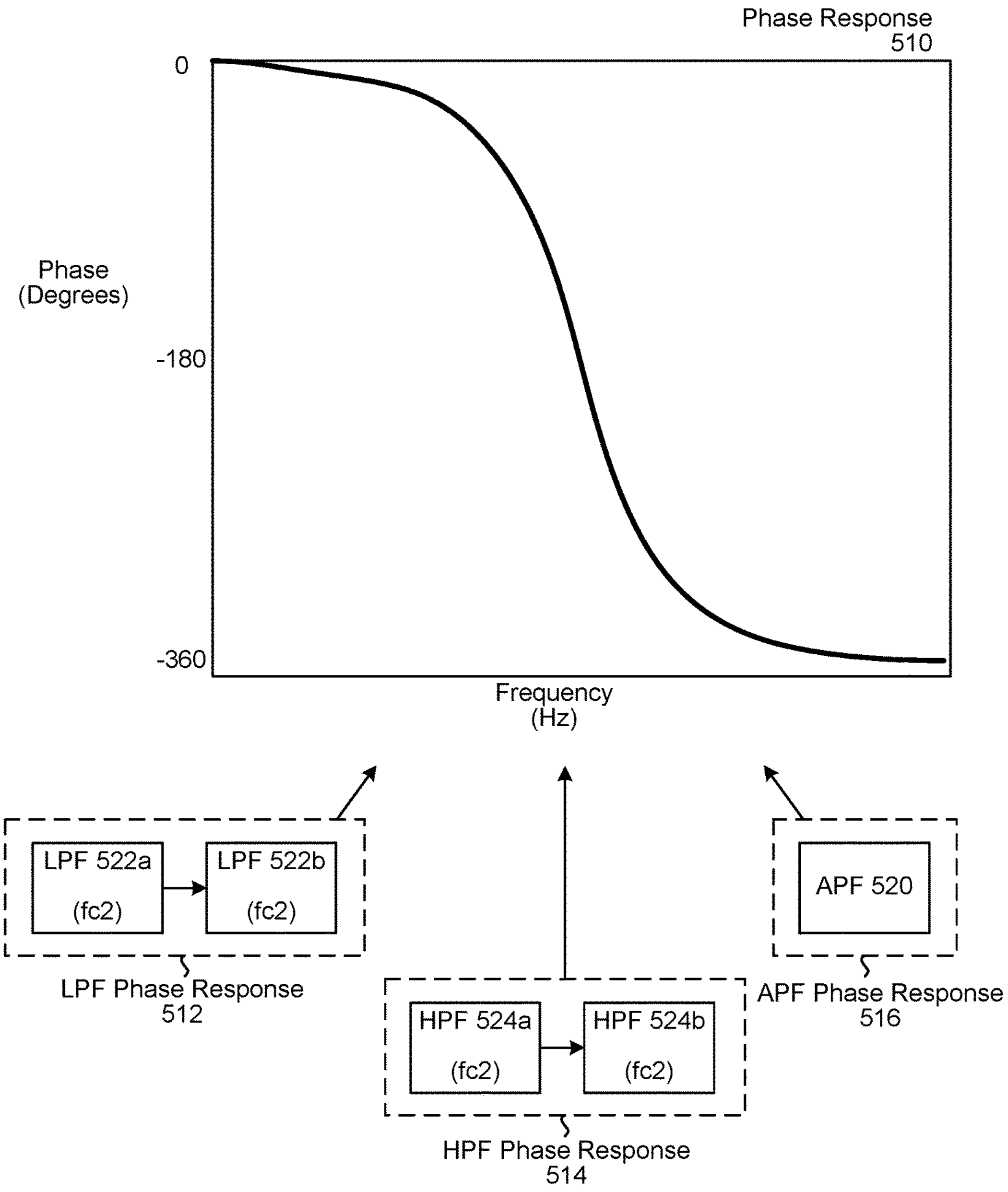
FIG. 5 illustrates phase responses of filters according to embodiments of the present disclosure.

FIG. 5 illustrates phase responses of filters according to embodiments of the present disclosure. FIG. 5 illustrates a phase response 510 associated with the LPFs 522, HPFs 524 and APF 520. As illustrated in FIG. 5, a LPF phase response 512 associated with LPFs 522 is identical to a HPF phase response 514 associated with HPFs 524. Thus, a first output of the LPFs 522 will remain in phase with a second output of the HPFs 524. In addition, the APF 520 may be configured so that an APF phase response 516 associated with the APF 520 is identical to both the LPF phase response 512 and the HPF phase response 514. Thus, a third output of the APF 520 will remain in phase with the first output and the second output. As a result, each stage of the reconfigurable filter bank 104 results in an identical phase shift between outputs of the LPF 522, the HPF 524 and the APF 520. Therefore, outputs of the reconfigurable filter bank 104 may be aligned (e.g., phase shifts equal so that outputs are in phase) despite being filtered by the LPFs 522, HPFs 524, APFs 520 and/or a combination thereof.

Figure 6A:
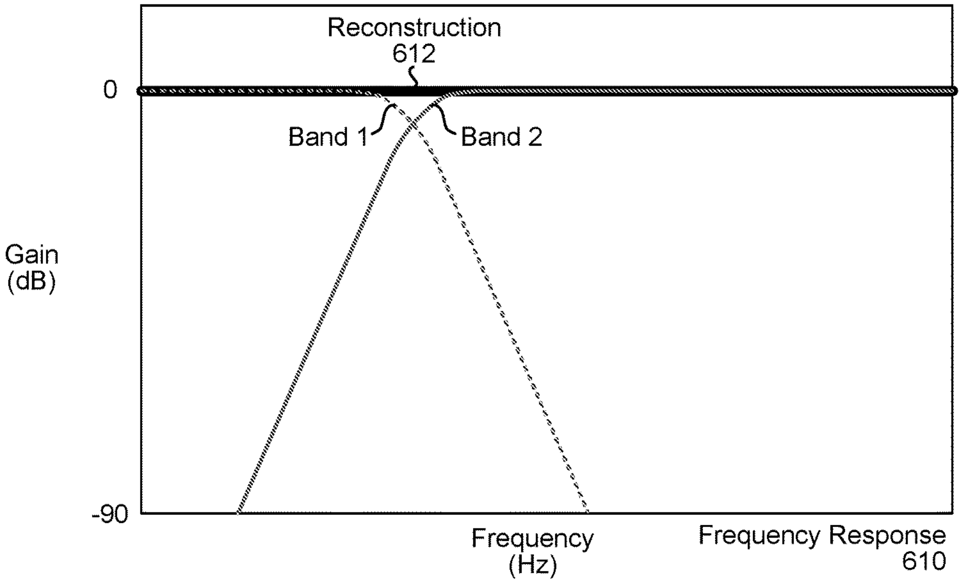
FIGS. 6A-6B illustrate magnitude responses of multiband filter banks according to embodiments of the present disclosure.
Figure 6B:
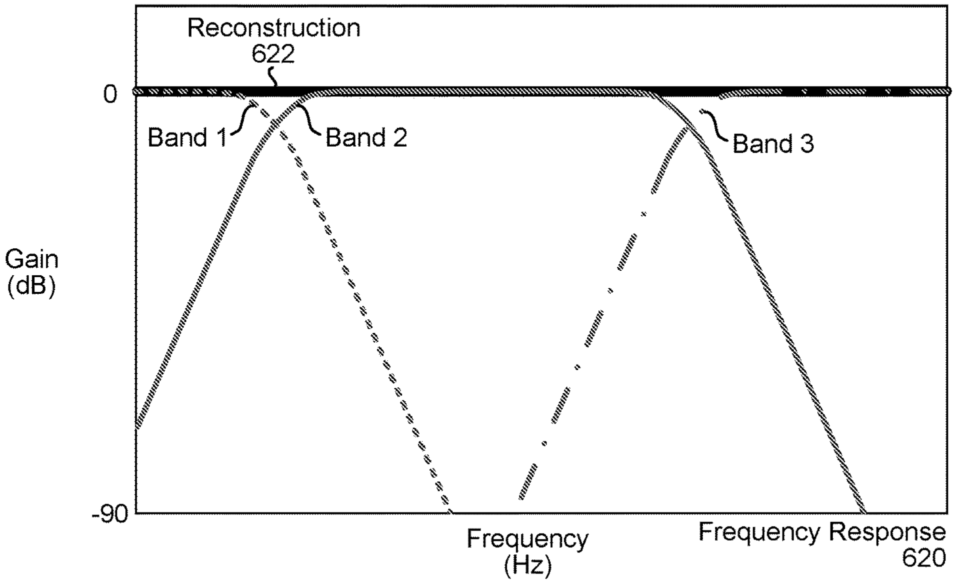

FIGS. 6A-6B illustrate magnitude responses of multiband filter banks according to embodiments of the present disclosure. FIG. 6A illustrates a frequency response 610 of Band 1 (e.g., output of a LPF pair), Band 2 (e.g. output of HPF pair) and a reconstruction 612 of Band 1 and Band 2 (e.g., combined output). As illustrated in FIG. 6A, the reconstruction 612 is near-ideal and doesn't include cross-band ripples or other distortion, resulting in an improved signal-to-noise ratio (SNR) output. Similarly, FIG. 6B illustrates a frequency response 620 of Band 1 (e.g., output of APF of second stage), Band 2 (e.g. output of LPF pair of second stage), Band 3 (e.g., output of HPF pair of second stage) and a reconstruction 622 of Band 1, Band 2 and Band 3 (e.g., combined output). As illustrated in FIG. 6B, the reconstruction 622 is near-ideal and doesn't include cross-band ripples or other distortion, resulting in an improved signal-to-noise ratio (SNR) output.

Figure 7A:
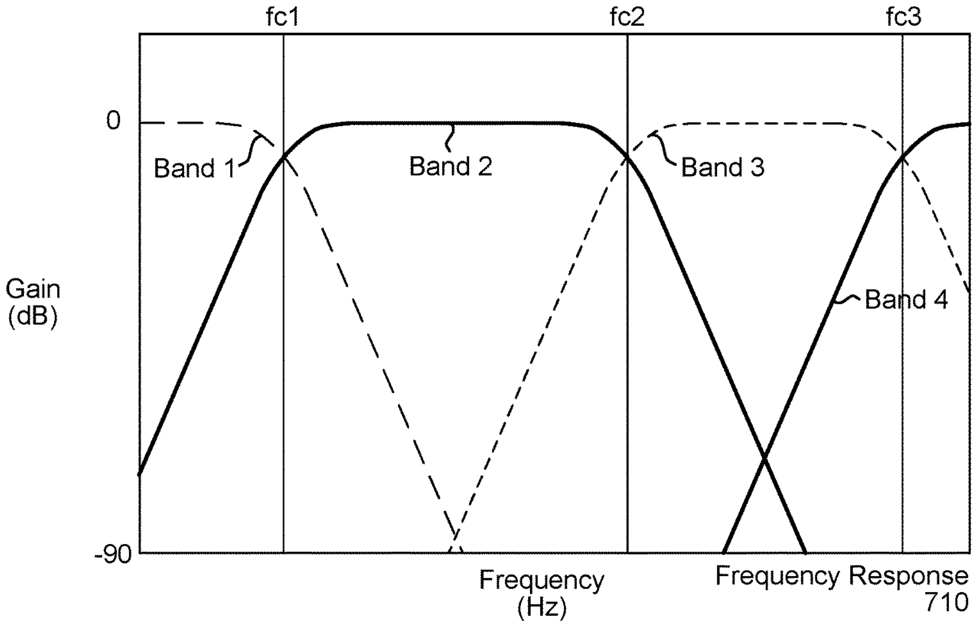
FIGS. 7A-7B illustrate an example of dynamically reconfiguring the filter bank according to embodiments of the present disclosure.
Figure 7B:
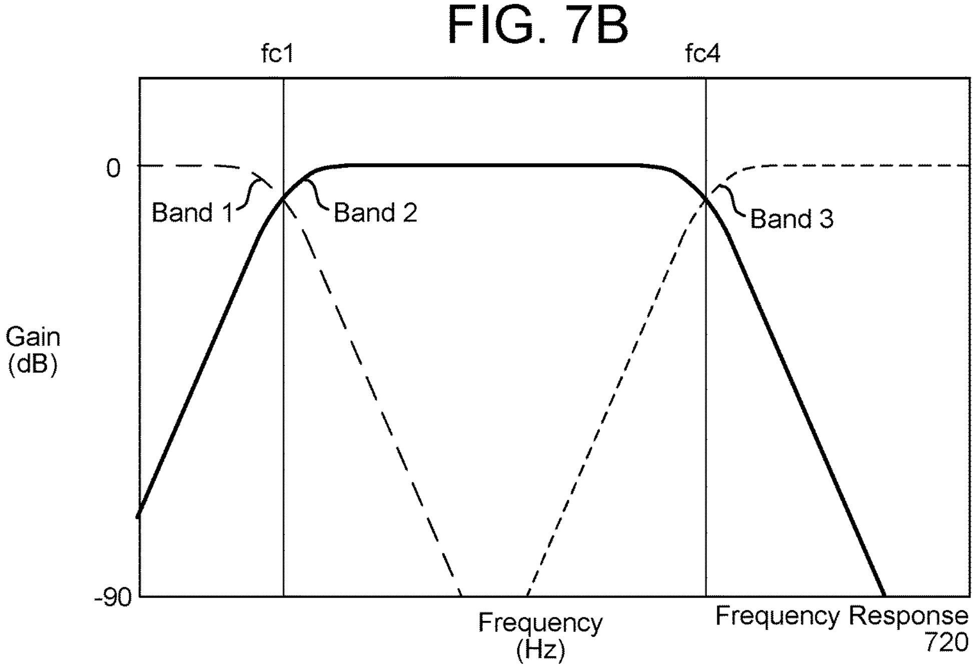

FIGS. 7A-7B illustrate an example of dynamically reconfiguring the filter bank according to embodiments of the present disclosure. FIG. 7A illustrates a frequency response 710 of four-band output from a reconfigurable filter bank 104 at a first time. For example, the frequency response 710 includes Band 1, Band 2, Band 3 and Band 4, separated by crossover frequencies fc1, fc2 and fc3. The reconfigurable filter bank 104 may generate the four-band output for a first component, such as a beamformer, during a first stage of signal processing.

In contrast, FIG. 7B illustrates a frequency response 720 of three-band output from the reconfigurable filter bank 104 at a second time. For example, the frequency response 720 includes Band 1, Band 2 and Band 3, separated by crossover frequencies fc1 and fc2. The reconfigurable filter bank 104 may generate the three-band output for a second component, such as an AEC component, during a second stage of signal processing. As illustrated in FIGS. 7A-7B, the reconfigurable filter bank 104 may dynamically change the number of bands and their non-uniform bandwidths during device operation based on a user, an application, a component and/or the like.

Figure 8A:
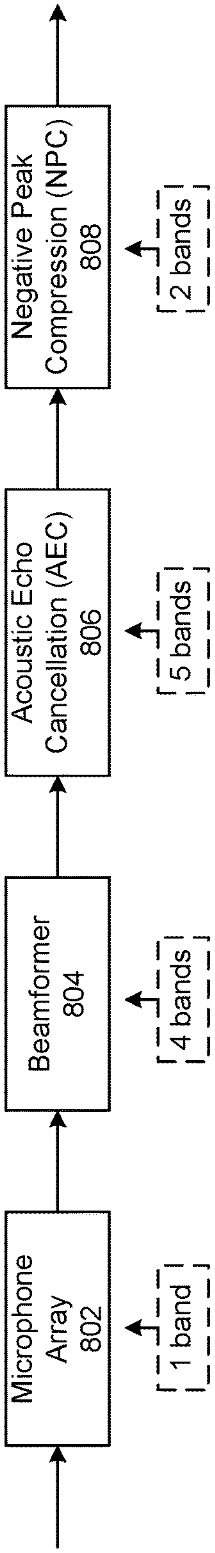
FIGS. 8A-8B illustrate an example of using reconfigurable filter banks during signal processing according to embodiments of the present disclosure.
Figure 8B:
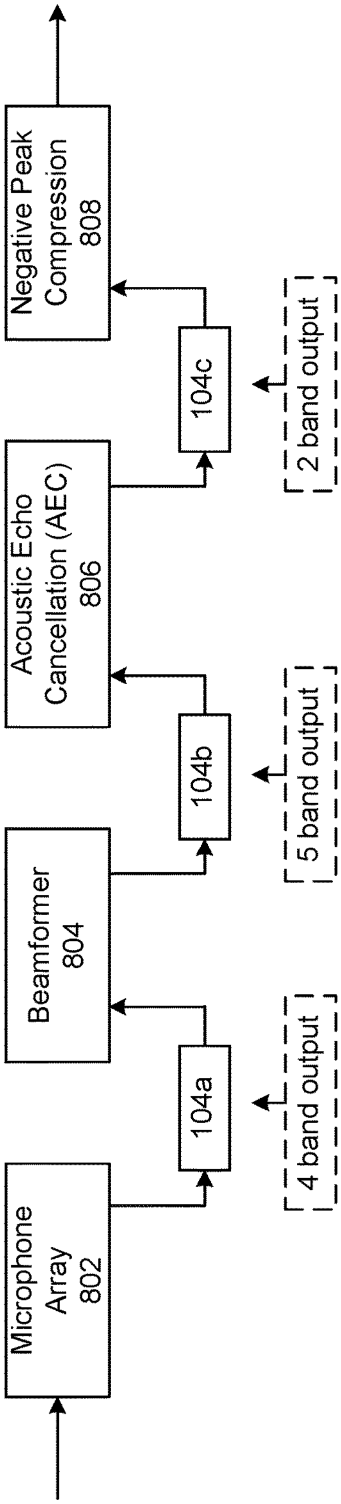

FIGS. 8A-8B illustrate an example of using reconfigurable filter banks during signal processing according to embodiments of the present disclosure. FIG. 8A illustrates an example of components used during signal processing and the desired inputs for each component. For example, a microphone array 802 may process a single-band input, while a beamformer 804 may process a four-band input, an Acoustic Echo Cancellation (AEC) 806 may process a five-band input and a Negative Peak Compression (NPC) 808 may process a two-band input. In order to provide the desired inputs for each component, the device 104 may use one or more reconfigurable filter banks 104 between each component during signal processing. For example, reconfigurable filter bank 104*a* may receive a single-band input and generate a four-band output, reconfigurable filter bank 104*b* may receive a four-band input and generate a five-band output, and reconfigurable filter bank 104*c* may receive a five-band input and generate a two-band output. While reconfigurable filter banks 104*a*-104*c* are illustrated as separate components, the disclosure is not limited thereto and a single reconfigurable filter bank 104 may be reconfigured multiple times to perform the functions of reconfigurable filter banks 104*a*-104*c* without departing from the present disclosure.

Figure 9:
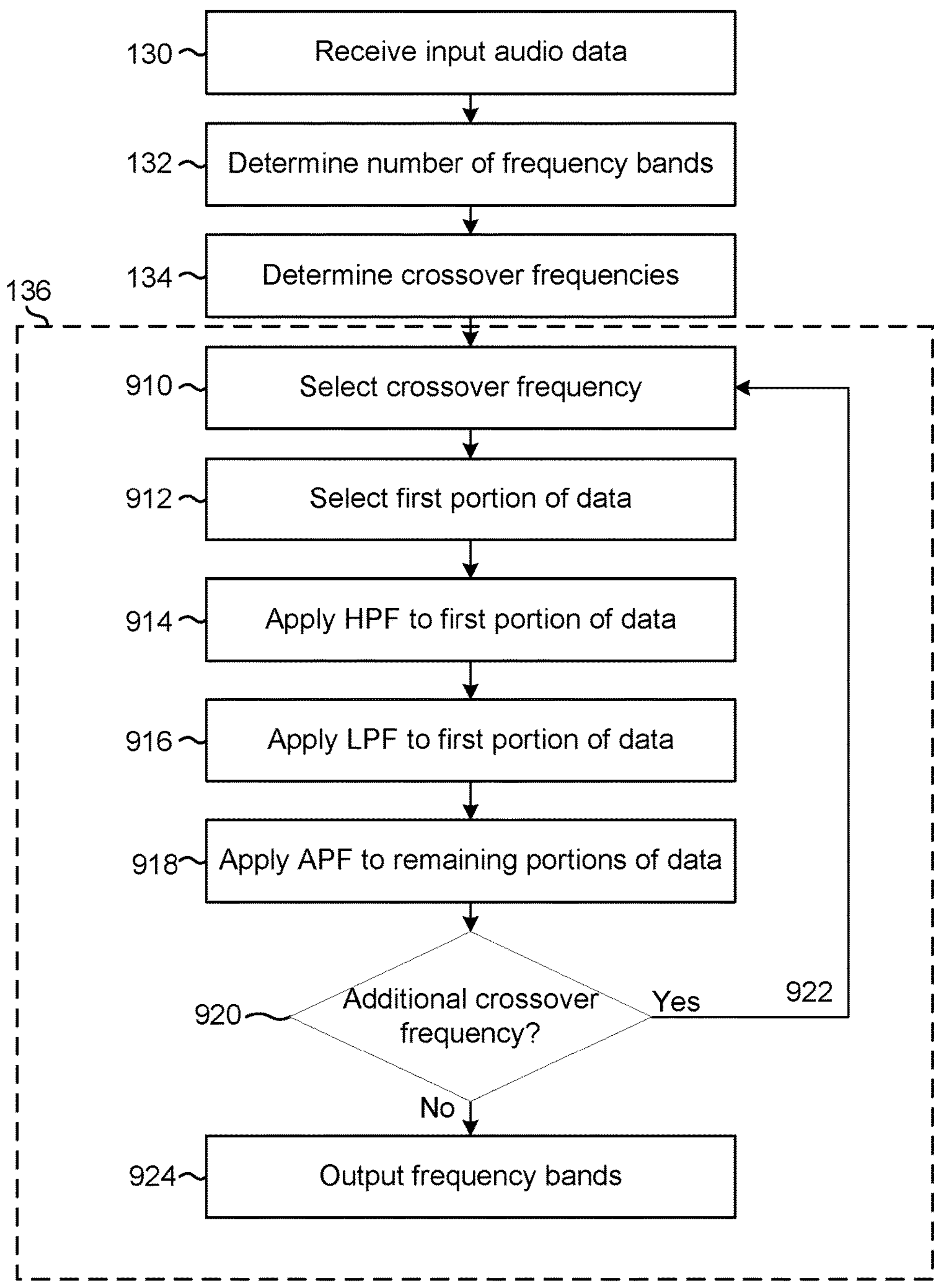
FIG. 9 is a flowchart conceptually illustrating an example method for filtering a signal using a reconfigurable filter bank according to embodiments of the present disclosure.

FIG. 9 is a flowchart conceptually illustrating an example method for filtering a signal using a reconfigurable filter bank according to embodiments of the present disclosure. As illustrated in FIG. 9, the device 102 may receive (130) input audio data, determine (132) a number of frequency bands and determine (134) crossover frequencies between the frequency bands. To filter the input audio data in step 136, the device 102 may select (910) a crossover frequency, select (912) a first portion of data, apply (914) high-pass filtering to the first portion of data and apply (916) low-pass filtering to the first portion of data. The device 102 may then apply (918) all-pass filtering to remaining portions of data and determine (920) if there is an additional crossover frequency. If there is, the device 102 may loop (922) to step 910 and repeat steps 910-920 for the additional crossover frequency, such that each subsequent stage (e.g., loop) splits a portion of the output data from the previous stage to generate an additional frequency band. If the device 102 determines that there isn't an additional crossover frequency, the device 102 may output (924) the frequency bands.

Figure 10:
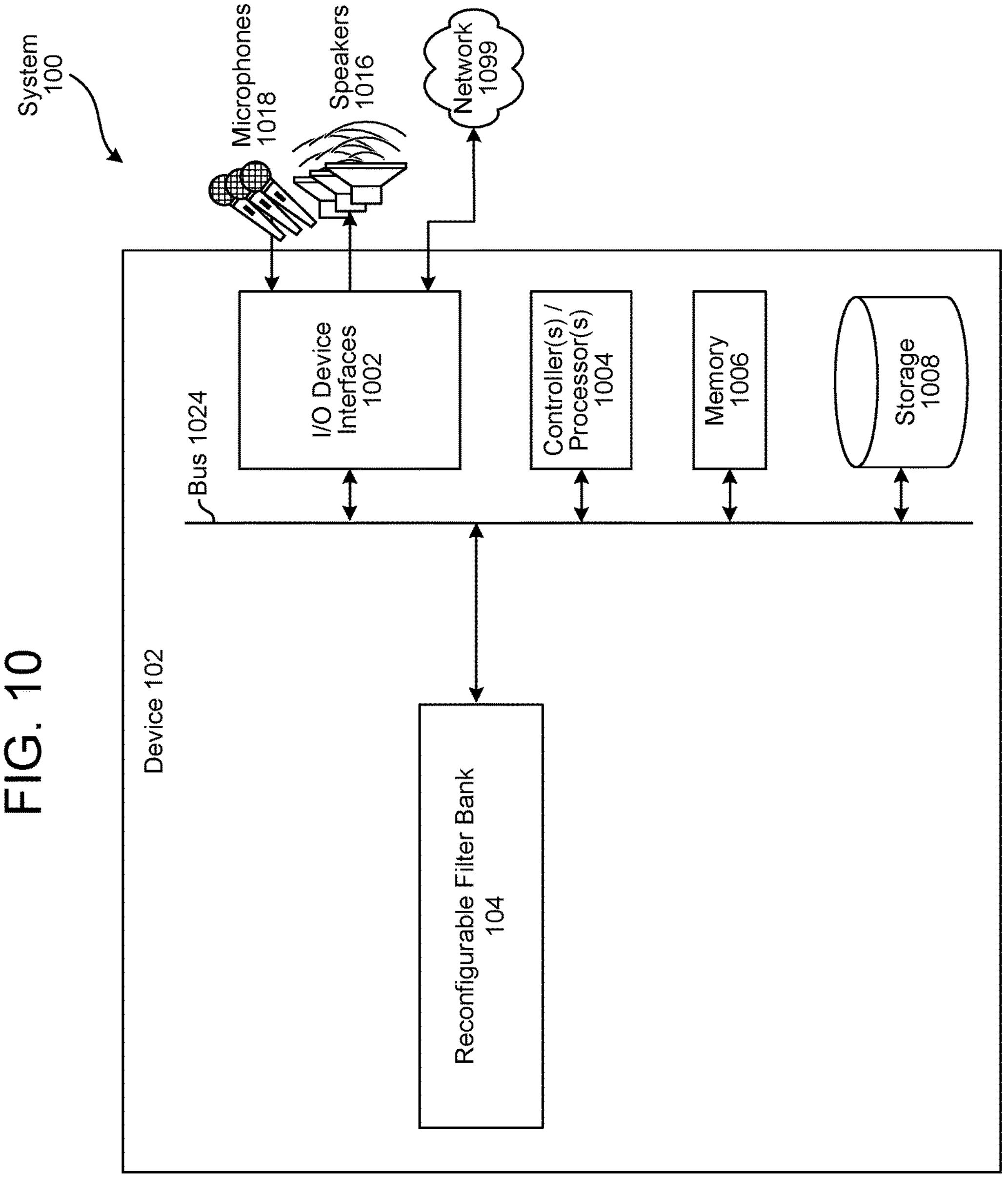
FIG. 10 is a block diagram conceptually illustrating example components of a system for echo cancellation according to embodiments of the present disclosure.

FIG. 10 is a block diagram conceptually illustrating example components of the system 100. In operation, the system 100 may include computer-readable and computer-executable instructions that reside on the device 102, as will be discussed further below.

The system 100 may include one or more audio capture device(s), such as a microphone 1018 or an array of microphones 1018. The audio capture device(s) may be integrated into the device 102 or may be separate. The system 100 may also include an audio output device for producing sound, such as speaker(s) 1016. The audio output device may be integrated into the device 102 or may be separate.

The device 102 may include an address/data bus 1024 for conveying data among components of the device 102. Each component within the device 102 may also be directly connected to other components in addition to (or instead of) being connected to other components across the bus 1024.

The device 102 may include one or more controllers/processors 1004, that may each include a central processing unit (CPU) for processing data and computer-readable instructions, and a memory 1006 for storing data and instructions. The memory 1006 may include volatile random access memory (RAM), non-volatile read only memory (ROM), non-volatile magnetoresistive (MRAM) and/or other types of memory. The device 102 may also include a data storage component 1008, for storing data and controller/processor-executable instructions (e.g., instructions to perform the algorithms illustrated in FIGS. 1 and/or 9). The data storage component 1008 may include one or more non-volatile storage types such as magnetic storage, optical storage, solid-state storage, etc. The device 102 may also be connected to removable or external non-volatile memory and/or storage (such as a removable memory card, memory key drive, networked storage, etc.) through the input/output device interfaces 1002.

Computer instructions for operating the device 102 and its various components may be executed by the controller(s)/processor(s) 1004, using the memory 1006 as temporary "working" storage at runtime. The computer instructions may be stored in a non-transitory manner in non-volatile memory 1006, storage 1008, or an external device. Alternatively, some or all of the executable instructions may be embedded in hardware or firmware in addition to or instead of software.

The device 102 includes input/output device interfaces 1002. A variety of components may be connected through the input/output device interfaces 1002, such as the speaker(s) 1016, the microphones 1018, and a media source such as a digital media player (not illustrated). The input/output interfaces 1002 may include A/D converters for converting the output of microphone 1018 if the microphones 1018 are integrated with or hardwired directly to device 102. If the microphones 1018 are independent, the A/D converters will be included with the microphones 1018, and may be clocked independent of the clocking of the device 102. Likewise, the input/output interfaces 1002 may include D/A converters for converting reference signal into an analog current to drive the speakers 1016, if the speakers 1016 are integrated with or hardwired to the device 102. However, if the speakers 1016 are independent, the D/A converters will be included with the speakers 1016, and may be clocked independent of the clocking of the device 102 (e.g., conventional Bluetooth speakers).

The input/output device interfaces 1002 may also include an interface for an external peripheral device connection such as universal serial bus (USB), FireWire, Thunderbolt or other connection protocol. The input/output device interfaces 1002 may also include a connection to one or more networks 1099 via an Ethernet port, a wireless local area network (WLAN) (such as WiFi) radio, Bluetooth, and/or wireless network radio, such as a radio capable of communication with a wireless communication network such as a Long Term Evolution (LTE) network, WiMAX network, 3G network, etc. Through the network 1099, the system 100 may be distributed across a networked environment.

The concepts disclosed herein may be applied within a number of different devices and computer systems, including, for example, general-purpose computing systems, multimedia set-top boxes, televisions, stereos, radios, server-client computing systems, telephone computing systems, laptop computers, cellular phones, personal digital assistants (PDAs), tablet computers, wearable computing devices (watches, glasses, etc.), other mobile devices, etc.

The above aspects of the present disclosure are meant to be illustrative. They were chosen to explain the principles and application of the disclosure and are not intended to be exhaustive or to limit the disclosure. Many modifications and variations of the disclosed aspects may be apparent to those of skill in the art. Persons having ordinary skill in the field of digital signal processing and echo cancellation should recognize that components and process steps described herein may be interchangeable with other components or steps, or combinations of components or steps, and still achieve the benefits and advantages of the present disclosure. Moreover, it should be apparent to one skilled in the art, that the disclosure may be practiced without some or all of the specific details and steps disclosed herein.

Aspects of the disclosed system may be implemented as a computer method or as an article of manufacture such as a memory device or non-transitory computer readable storage medium. The computer readable storage medium may be readable by a computer and may comprise instructions for causing a computer or other device to perform processes described in the present disclosure. The computer readable storage medium may be implemented by a volatile computer memory, non-volatile computer memory, hard drive, solid-state memory, flash drive, removable disk and/or other media. Some or all of the Acoustic Echo Cancellation (AEC) 806 may be implemented by a digital signal processor (DSP).

As used in this disclosure, the term "a" or "one" may include one or more items unless specifically stated otherwise. Further, the phrase "based on" is intended to mean "based at least in part on" unless specifically stated otherwise.

What is claimed is:

1. A computer-implemented method for separating an audio signal into frequency bands using a reconfigurable filter bank to process the frequency bands separately, the method comprising:

receiving input audio data corresponding to multiple frequencies;

receiving a first crossover frequency value as first input;

determining that the first crossover frequency value corresponds to a transition between a first frequency band and a second frequency band;

receiving a second crossover frequency value as second input;

determining that the second crossover frequency value corresponds to a transition between the second frequency band and a third frequency band;

blocking low frequencies of the input audio data that are associated with midrange and bass using a first high-pass filter and a second high-pass filter in series to generate first primary-stage output data, the first primary-stage output data corresponding to frequencies greater than the first crossover frequency value;

blocking high frequencies of the input audio data that are associated with treble using a first low-pass filter and a second low-pass filter in series to generate second primary-stage output data, the second primary-stage output data corresponding to frequencies less than the first crossover frequency value;

outputting all frequencies of the first primary-stage output data with equal gain using an all-pass filter to generate treble output data, the treble output data corresponding to the first frequency band, the all-pass filter having a first phase response;

blocking low frequencies of the second primary-stage output data that are associated with bass using a third high-pass filter and a fourth high-pass filter in series to generate midrange output data, the midrange output data corresponding to frequencies greater than the second crossover frequency value and corresponding to the second frequency band, the third high-pass filter and the fourth high-pass filter in series having a second phase response equal to the first phase response;

blocking high frequencies of the second primary-stage output data that are associated with midrange using a third low-pass filter and a fourth low-pass filter in series to generate bass output data, the bass output data corresponding to frequencies less than the second crossover frequency value and corresponding to the third frequency band, the third low-pass filter and the fourth low-pass filter in series having a third phase response equal to the first phase response;

generating treble processed data by performing acoustic echo cancellation on the treble output data;

generating midrange processed data by performing acoustic echo cancellation on the midrange output data;

generating bass processed data by performing acoustic echo cancellation on the bass output data; and generating output audio data by combining the treble processed data, the midrange processed data and the bass processed data.

2. The computer-implemented method of claim 1, further comprising:

receiving, during operation of the reconfigurable filter bank, a third crossover frequency value as third input;

determining that the third crossover frequency value corresponds to a transition between the third frequency band and a fourth frequency band;

outputting all frequencies of the treble output data with equal gain using a second all-pass filter to generate second treble output data, the second treble output data corresponding to the first frequency band, the second all-pass filter having a fourth phase response;

outputting all frequencies of the midrange output data with equal gain using a third all-pass filter to generate second midrange output data, the second midrange output data corresponding to the second frequency band, the third all-pass filter having a fifth phase response equal to the fourth phase response;

blocking low frequencies of the bass output data that are associated with deep bass using a fifth high-pass filter and a sixth high-pass filter in series to generate upper bass output data, the upper bass output data corresponding to frequencies greater than the third crossover frequency value and corresponding to the third frequency band, the fifth high-pass filter and the sixth high-pass filter in series having a sixth phase response equal to the fourth phase response; and blocking high frequencies of the bass output data that are associated with upper bass using a fifth low-pass filter and a sixth low-pass filter in series to generate subwoofer output data, the subwoofer output data corresponding to frequencies less than the third crossover frequency value and corresponding to the fourth frequency band, the fifth low-pass filter and the sixth low-pass filter in series having a seventh phase response equal to the fourth phase response.

3. The computer-implemented method of claim 1, wherein, a first stage is associated with the first crossover frequency value and includes the first high-pass filter, the second high-pass filter, the first low-pass filter and the second low-pass filter, first outputs of the first stage having the first phase response, and a second stage is associated with the second crossover frequency value and includes the all-pass filter, the third high-pass filter, the fourth high-pass filter, the third low-pass filter and the fourth low-pass filter, second outputs of the second stage having the first phase response.

4. The computer-implemented method of claim 1, wherein:

the input audio data includes a first channel and a second channel, and the treble output data, the midrange output data and the bass output data correspond to the first channel.

5. A computer-implemented method, comprising:

receiving input audio data corresponding to multiple frequencies;

receiving a first crossover frequency value;

determining that the first crossover frequency value corresponds to a transition between a first frequency band and a second frequency band;

receiving a second crossover frequency value;

determining that the second crossover frequency value corresponds to a transition between the second frequency band and a third frequency band;

blocking low frequencies of the input audio data using a first high-pass filter and a second high-pass filter in series to generate first primary-stage output data, the first primary-stage output data corresponding to frequencies greater than the first crossover frequency value;

blocking high frequencies of the input audio data using a first low-pass filter and a second low-pass filter in series to generate second primary-stage output data, the second primary-stage output data corresponding to frequencies less than the first crossover frequency value;

passing all frequencies of the first primary-stage output data using an all-pass filter to generate first secondary-stage output data, the first secondary-stage output data corresponding to the first frequency band;

blocking low frequencies of the second primary-stage output data using a third high-pass filter and a fourth high-pass filter in series to generate second secondary-stage output data, the second secondary-stage output data corresponding to frequencies greater than the second crossover frequency value and corresponding to the second frequency band; and blocking high frequencies of the second primary-stage output data using a third low-pass filter and a fourth low-pass filter in series to generate third secondary-stage output data, the third secondary-stage output data corresponding to frequencies less than the second crossover frequency value and corresponding to the third frequency band.

6. The computer-implemented method of claim 5, further comprising:

generating first processed data by performing first acoustic echo cancellation processing on the first secondary-stage output data;

generating second processed data by performing second acoustic echo cancellation processing on the second secondary-stage output data;

generating third processed data by performing third acoustic echo cancellation processing on the third secondary-stage output data; and generating output audio data by combining the first processed data, the second processed data and the third processed data.

7. The computer-implemented method of claim 5, wherein:

the input audio data includes a first channel and a second channel, and the first secondary-stage output data, the second secondary-stage output data and the third secondary-stage output data correspond to the first channel.

8. The computer-implemented method of claim 5, wherein a first phase response associated with the third high-pass filter and the fourth high-pass filter is equal to a second phase response associated with the third low-pass filter and the fourth low-pass filter and a third phase response associated with the all-pass filter.

9. The computer-implemented method of claim 5, further comprising:

receiving, during operation, a third crossover frequency value;

determining that the third crossover frequency value corresponds to a transition between the third frequency band and a fourth frequency band;

passing all frequencies of the first secondary-stage output data using a second all-pass filter to generate first tertiary-stage output data, the first tertiary-stage output data corresponding to the first frequency band;

passing all frequencies of the second secondary-stage output data using a third all-pass filter to generate second tertiary-stage output data, the second tertiary-stage output data corresponding to the second frequency band;

blocking low frequencies of the third secondary-stage output data using a fifth high-pass filter and a sixth high-pass filter in series to generate third tertiary-stage output data, the third tertiary-stage output data corresponding to frequencies greater than the third crossover frequency value and corresponding to the third frequency band; and blocking high frequencies of the third secondary-stage output data using a fifth low-pass filter and a sixth low-pass filter in series to generate fourth tertiary-stage output data, the fourth tertiary-stage output data corresponding to frequencies less than the third crossover frequency value and corresponding to the fourth frequency band.

10. The computer-implemented method of claim 5, further comprising:

determining, at a first time, a first number of output frequency bands;

determining, during operation at a second time after the first time, a second number of output frequency bands; and generating fourth tertiary-stage output data corresponding to a fourth frequency band.

11. The computer-implemented method of claim 5, wherein, a first stage is associated with the first crossover frequency value and includes the first high-pass filter, the second high-pass filter, the first low-pass filter and the second low-pass filter, first outputs of the first stage having a first phase response, and a second stage is associated with the second crossover frequency value and includes the all-pass filter, the third high-pass filter, the fourth high-pass filter, the third low-pass filter and the fourth low-pass filter, second outputs of the second stage having the first phase response.

12. The computer-implemented method of claim 5, wherein:

the all-pass filter is a Butterworth second-order infinite impulse response (IIR) filter;

the third high-pass filter and the fourth high-pass filter are Butterworth second-order IIR filters; and the third low-pass filter and the fourth low-pass filter are Butterworth second-order IIR filters.

13. A device, comprising:

at least one processor;

a memory device including instructions operable to be executed by the at least one processor to configure the device to:

receive input audio data corresponding to multiple frequencies;

receive a first crossover frequency value;

determine that the first crossover frequency value corresponds to a transition between a first frequency band and a second frequency band;

receive a second crossover frequency value;

determine that the second crossover frequency value corresponds to a transition between the second frequency band and a third frequency band;

block low frequencies of the input audio data using a first high-pass filter and a second high-pass filter in series to generate first primary-stage output data, the first primary-stage output data corresponding to frequencies greater than the first crossover frequency value;

block high frequencies of the input audio data using a first low-pass filter and a second low-pass filter in series to generate second primary-stage output data, the second primary-stage output data corresponding to frequencies less than the first crossover frequency value;

pass all frequencies of the first primary-stage output data using an all-pass filter to generate first secondary-stage output data, the first secondary-stage output data corresponding to the first frequency band;

block low frequencies of the second primary-stage output data using a third high-pass filter and a fourth high-pass filter in series to generate second secondary-stage output data, the second secondary-stage output data corresponding to frequencies greater than the second crossover frequency value and corresponding to the second frequency band; and block high frequencies of the second primary-stage output data using a third low-pass filter and a fourth low-pass filter in series to generate third secondary-stage output data, the third secondary-stage output data corresponding to frequencies less than the second crossover frequency value and corresponding to the third frequency band.

14. The device of claim 13, wherein the instructions further configure the device to:

generate first processed data by performing first acoustic echo cancellation processing on the first secondary-stage output data;

generate second processed data by performing second acoustic echo cancellation processing on the second secondary-stage output data;

generate third processed data by performing third acoustic echo cancellation processing on the third secondary-stage output data; and generate output audio data by combining the first processed data, the second processed data and the third processed data.

15. The device of claim 14, wherein:

the input audio data includes a first channel and a second channel, and the first secondary-stage output data, the second secondary-stage output data and the third secondary-stage output data correspond to the first channel.

16. The device of claim 13, wherein a first phase response associated with the third high-pass filter and the fourth high-pass filter is equal to a second phase response associated with the third low-pass filter and the fourth low-pass filter and a third phase response associated with the all-pass filter.

17. The device of claim 13, wherein the instructions further configure the device to:

receiving, during operation, a third crossover frequency value;

determining that the third crossover frequency value corresponds to a transition between the third frequency band and a fourth frequency band;

passing all frequencies of the first secondary-stage output data using a second all-pass filter to generate first tertiary-stage output data, the first tertiary-stage output data corresponding to the first frequency band;

passing all frequencies of the second secondary-stage output data using a third all-pass filter to generate second tertiary-stage output data, the second tertiary-stage output data corresponding to the second frequency band;

block low frequencies of the third secondary-stage output data using a fifth high-pass filter and a sixth high-pass filter in series to generate third tertiary-stage output data, the third tertiary-stage output data corresponding to frequencies greater than the third crossover frequency value and corresponding to a fourth frequency band; and block high frequencies of the third secondary-stage output data using a fifth low-pass filter and a sixth low-pass filter in series to generate fourth tertiary-stage output data, the fourth tertiary-stage output data corresponding to frequencies less than the third crossover frequency value and corresponding to a fifth frequency band.

18. The device of claim 13, wherein the instructions further configure the device to:

determine, at a first time, a first number of output frequency bands;

determine, during operation at a second time after the first time, a second number of output frequency bands; and generate fourth first tertiary-stage output data corresponding to a fourth frequency band.

19. The device of claim 13, wherein:

a first stage is associated with the first crossover frequency value and includes the first high-pass filter, the second high-pass filter, the first low-pass filter and the second low-pass filter, first outputs of the first stage having a first phase response, and a second stage is associated with the second crossover frequency value and includes the all-pass filter, the third high-pass filter, the fourth high-pass filter, the third low-pass filter and the fourth low-pass filter, second outputs of the second stage having the first phase response.

20. The device of claim 13, wherein:

the all-pass filter is a Butterworth second-order infinite impulse response (IIR) filter;

the third high-pass filter and the fourth high-pass filter are Butterworth second-order IIR filters; and the third low-pass filter and the fourth low-pass filter are Butterworth second-order IIR filters.

* * * * *